Aug. 25, 1964 T. RUMMEL 3,145,447

METHOD OF PRODUCING A SEMICONDUCTOR DEVICE

Filed Feb. 1, 1961

United States Patent Office 3,145,447

Patented Aug. 25, 1964

3,145,447

METHOD OF PRODUCING A SEMICONDUCTOR DEVICE

Theodor Rummel, Munich, Germany, assignor to Siemens & Halske Aktiengesellschaft, Berlin-Siemensstadt, Germany, a corporation of Germany Filed Feb. 1, 1961, Ser. No. 86,389
Claims priority, application Germany Feb. 12, 1960
14 Claims. (Cl. 29—25.3)

My invention relates to a method of producing transistors, rectifiers, phototransistors and other electronic semiconductor devices, and more particularly to a method of producing a semiconductor device, particularly of silicon, with at least one p-n junction in which sequential layers of different conductance and/or different type of conductance are obtained by monocrystalline growth of semiconductor material pyrolytically reduced and recipitated from a gaseous compound.

According to a known pyrolytic method, a germanium layer is grown on a germanium body by passing a gaseous germanium halogenide over a monocyrstalline germanium carrier in a processing chamber which, together with its contents, is heated to a sufficiently high temperature to obtain a thermal decomposition of the halogenide. For imparting to the monocrystalline precipitation a predetermined type of conductance, the gaseous germanium halogenide contains an admixed doping impurity that determines the type of conductance in the product. This method can be used for producing a sequence of layers having either a different degree of conductance or different conductance types respectively. By controlling the proportion of dope supplied to the gaseous silicon compound, the conductance of the deposited layer or layers can be accordingly controlled or modified. For example, a graduation of conductance in the direction toward the p-n junction and away from this junction can thus be obtained.

To make such stratified semiconductor bodies suitable as rectifiers, transistors or similar electronic semiconductor devices, it has been necessary to provide them with electric electrodes or terminal members in a subsequent, separate operation.

It is an object of my invention to simplify the production of such grown plural-strata semiconductor devices inclusive of the metallic electrodes or terminals required for completing them electrically.

To this end, and in accordance with a feature of my invention, I place monocrystalline semiconductor bodies upon a metallic support and then cause a deposition of semiconductor material to occur on the bodies in the above-described manner, namely by pyrolytic decomposition of a gaseous compound of the same semiconductor material and, if necessary, admixing dope substance to the gaseous compound. As a result, one or more monocrystalline layers are grown and coalesced with the original semiconductor body which at the same time becomes coalesced or bonded to the metallic support. Thereafter, I subdivide the metallic support so that respective portions remain connected with the individual stratified semiconductor bodies and seves as an electric connecting terminal for the completed device.

According to another feature of my invention, the above-described method is performed by having the metallic support for the semiconductor bodies form the bottom of the reaction chamber in which the pyrolytic decomposition is effected. This prevents any semiconductor material from being precipitated upon the bottom side of the support and hence upon part of the electric terminal member that ultimately remains an integral component of the semiconductor devices being produced.

According to another, preferred feature of my invention, a metal sheet is placed on top of the last grown layer after completion of the pyrolytic precipitation, and the assembly is then heated to a temperature at which the metal top sheet coalesces with the uppermost semiconductor layer. This metal sheet, which may be perforated or may be constituted by a wire mesh, extends over all semiconductor devices located in the reaction chamber, so that it is in contact engagement with the last grown layer of all of these devices. Upon completion of the method, the metal sheet or mesh is cut so that its individual portions form another terminal of each semiconductor device.

To prevent the semiconductor structure from becoming contaminated from the metallic support or the metallic cover sheet, these metal components preferably are silicon coated on the side facing the semiconductor bodies. For this purpose the metal to serve as a support or cover is first heated in vacuum or in a hydrogen atmosphere to a temperature above 1100° C. so that the impurities evaporate out of the sheet. Then a flow of silicochloroform and hydrogen is passed over the sheet at a temperature of about 1100° C. so that silicon is separated and precipitated upon the sheet. The metal sheet, now coated with a silicon layer of approximately 20 microns thickness, is then employed in the above-described manner as a support or cover for the semiconductor bodies to ultimately form electric terminals of the individual semiconductor devices.

Particularly suitable metals for the above-mentioned support or cover are molybdenum and tantalum. Molybdenum is preferable because it does not so readily embrittle as tantalum when heated to glowing temperature in the hydrogen-containing pyrolysis atmosphere. The molybdenum grows irremovably together with the semiconductor material and produces a barrier-free (ohmic) contact.

For obtaining a particular geometric shape of the grown semiconductor layers, part of the semiconductor body or of the last previously grown layer may be covered and masked off during the continuing pyrolytic precipitation. This affords, for example, the production of semiconductor devices in which the cross section of the semiconductors body decreases gradually or incrementally from one electrode to another, such as from the collector toward the base of a transistor. This results in a very slight capacitance conjointly with a good heat dissiptation, without requiring the application of an etching step after completion of the precipitation method. Suitable as covering or masking materials for the just-mentioned purpose are quartz, or $SiO_2$ obtained by oxidation of silicon, Sinterkorund, beryllium oxide or silicon carbide.

The necessary pyrolytic precipitation temperature is preferably obtained by heating the metallic support which simultaneously constitutes the bottom of the reaction chamber. The heating can be effected by radiation which, if desired, may be controlled and concentrated by optical means. The heating of the support may also be effected electrically by induction heating, or by resistance heating of the support, such as by providing electrical resistance heaters adjacent to the support or by passing electric heating current directly through the metal of the supporting sheet.

When growing the doped layers, attention must be given to the requirement that the rate of growth is to be small relative to the rate of diffusion of the doping substances. Particularly favorable are phosphorous to serve as donor and boron to serve as acceptor relative to semiconductors of silicon. By varying the flow velocity or the molar ratio of the reaction gas, a desired rate of precipitation can be adjusted.

The invention will be further described with reference to the drawing in which.

Figure 1:
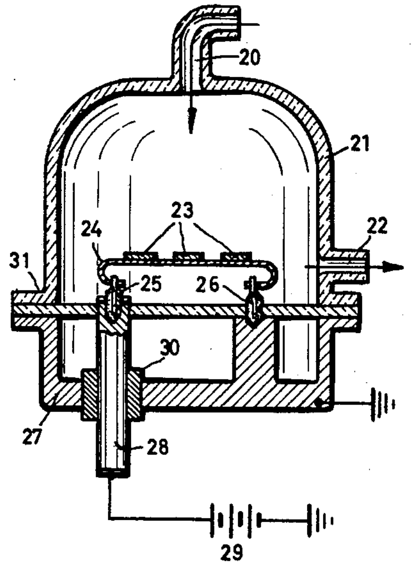
FIG. 1 shows in vertical section an apparatus for performing the method of the invention.

The reaction vessel shown in FIG. 1 comprises a hood or bell 21 of quartz and a bottom structure 27 of metal. A planar pane 31, likewise of quartz, partitions the vessel into two chambers. Mounted in the reaction chamber proper, above the pane 31, is a metallic support 24 consisting, for example, of a sheet of molybdenum. A number of semiconductor discs 23, for example of hyperpure silicon, are placed upon the supporting sheet 24. Only three such discs are shown, although it will be understood that it is preferable in practice to thus accommodate a larger number of discs. The reaction gas to be thermally decomposed passes into the reaction chamber through an inlet nipple 20. The residual gases leave the reaction chamber through an outlet nipple 22. The heating of the disc 23 to pyrolytic precipitation temperature is effected by heating the metal support 24.

In the embodiment of FIG. 1 the support is heated by directly passing electric current therethrough. Used as current supply terminals are two carbon electrodes 25 and 26. The electrode 26 is conductively connected with the bottom structure 27 of the apparatus and thus is kept on the same electric potential, namely ground potential. The second electrode 25 is connected to a lead 28 which passes through the bottom structure 27 to the outside of the apparatus and is insulated from the bottom structure by means of a bushing 30. The conductor 28 is connected with one pole of a current-supply source 29 whose other pole is grounded.

During operation, hyperpure silicon is precipitated from the reaction gas onto the surfaces of the hyperpure silicon discs 23 which coalesce with the metallic supporting sheet 24. During such precipitation the discs are kept at a substantially constant temperature between 950 and 1250° C. After the silicon discs have attained the required thickness and the pyrolytic method is completed, the sheet 24 with the attached silicon bodies is removed. The sheet 24 is then subdivided, and the portion remaining attached to each individual semiconductor body then forms an electric connecting terminal of the semiconductor device.

The doping of the different layers grown in the above-described manner can be effected in the same reaction vessel by adding corresponding doping substance to the reaction gas mixture, or it may be effected in a separate processing vessel. In the latter case, the support 24 with the discs 23 must be conveyed or sluiced out of the pyrolytic processing vessel to another vessel which makes it inevitable to have the grown layers exposed to air for an appreciable length of time. A sufficiently short access of air, however, is not detrimental because the then forming thin oxide coatings will thereafter evaporate from the semiconductor bodies during the preheating in hydrogen which preferably precedes the supply of gaseous silicon halogenide and hence the precipitation process proper.

Figure 2:
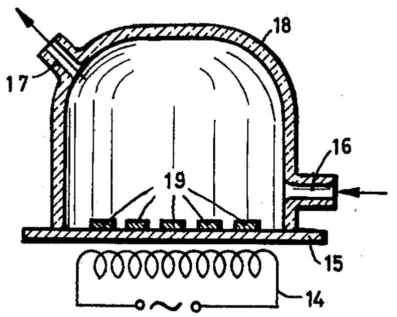
FIG. 2 shows schematically a modified form of such apparatus.

In the apparatus schematically illustrated in FIG. 2, a number of semiconductor discs 19, for example of hyperpure silicon, are placed upon the bottom plate 15 of the reaction vessel, this plate consisting preferably of molybdenum. The molybdenum sheet 15 is inductively heated by an electric conductance coil 14 energized from a source of alternating voltage. In this manner the semiconductor discs are heated to the precipitation temperature, preferably between 950 and 1250° C. The reaction gas passes into the reaction chamber through an inlet nipple 16 of the quartz bell 18. While passing over the silicon plates 19, the reaction gas is thermally decomposed and the resulting pure silicon is precipitated upon the semiconductor disc. In this manner, a semiconductor layer of the desired thickness and conductance is grown on each original semiconductor plate. The residual gases pass out of the reaction chamber through a nipple 17.

As mentioned above, another electric terminal can be bonded to the semiconductor body by placing a metal sheet on top of all semiconductor bodies upon completion of the pyrolytic process. For this purpose the bell 18 or 21 is temporarily removed, the cover sheet placed upon the completed semiconductor bodies, and thereafter the assembly again heated to the temperature, for example 950° C., required for causing the cover sheet to coalesce with the top surface of the semiconductor layers.

For further explaining the invention, there will be described hereinafter by way of example the production of a rectifier and of a transistor. The method described can be performed with the aid of apparatus according to FIG. 1 or according to FIG. 2, for example.

Figure 3:
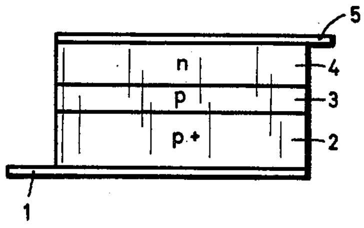
FIG. 3 show schematically a rectifier diode made by the method of the invention.

A rectifier diode made according to the above-described method is shown in FIG. 3. Used for the production of such rectifiers were a molybdenum sheet of 0.1 mm. thickness. After completion of the pyrolytic precipitation and subdivision of the sheet, a portion of the sheet constituted the electric terminal 1 of the rectifier. Placed upon the molybdenum sheet were low-ohmic doped silicon discs of p-type conductance having about 0.1 to 0.5 mm. thickness and a diameter of one to a few millimeters. One of these original discs constitutes the layer denoted by 2 in FIG. 3. The number of the discs thus placed upon the molybdenum sheet is to be chosen so that the heat radiating from the exposed portions of the supporting sheet remains sufficient for the thermal decomposition of the reaction gas. The surface of the molybdenum sheet is preferably silicized as described in the foregoing. The silicon surface is preferably purified by etching and subsequent annealing in a flow of hydrogen.

After closing the reaction vessel, the mixture of hydrogen and silicochloroform plus an addition of borbromide or another boron halogenide were passed into the vessel, and the supporting sheet was heated to the precipitation temperature, preferably above 950° C. The process was continued until a thin high-ohmic p-type layer 3 of about 2 micron thickness was precipitated, having a specific resistance of about 3 ohm·cm. Thereafter a low-ohmic n-type layer 4 of about 10 micron thickness was precipitated, having a specific resistance between a few one-tenths and a few ohm·cm. The growing period for obtaining 1 micron layer thickness in this process was approximately 8 seconds. On completion of the layer 4, a sheet or mesh of molybdenum was placed upon the last grown layer 4 and was heated so as to grow together with the layer, as described in the foregoing. After subdividing the supporting sheet as well as the cover sheet, a portion of the sheet constituted the barrier-free (ohmic) contact terminal 5 of the rectifier.

A rectifier device thus produced can be encapsulated in the conventional manner, and any disturbing material layers around the periphery of the device can be eliminated by etching, grinding or sand-blasting. The supporting and cover sheets of metal can be subdivided either before or after the just-mentioned treatment in order to separate the individual rectifier units from each other. Thereafter, the supporting member and terminal 1 can be soldered upon a heat-conducting metal such as copper to operate as a heat sink in the conventional manner. The process affords producing rectifiers of any desired inverse voltage rating.

Figure 4:
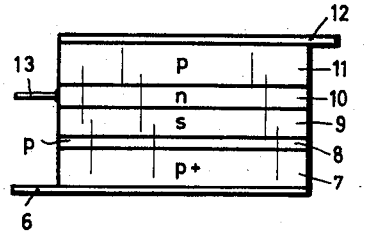
FIG. 4 shows schematically a transistor produced in accordance with the invention.

The transistor made according to the invention, as shown in FIG. 4, comprises a p-type layer 7 of very low ohmic resistance consisting, as in the example of the rectifier, of hyperpure monocrystalline silicon. This layer constitutes one of the original discs placed into the apparatus according to FIG. 1 or FIG. 2. A p-type collector layer 8 is grown on the layer 7 by the pyrolytic process described above and consists of hyperpure silicon having a somewhat higher ohmic resistance, the specific resistance being approximately 5 ohm·cm. The low-ohmic layer 7 serves only as a current-supply means for the collector layer 8. The collector layer 8 proper can therefore be made very thin so that its current-flow resistance becomes negligible.

In the illustrated embodiment the collector layer 8 is only 1 micron thick. Deposited by pyrolytic decomposition upon the collector layer 8 is a high-ohmic intermediate layer 9 having a specific resistance of approximately 50 ohm·cm. and which has either p-type or n-type conductance. The layer 9 may also be given a higher ohmic resistance so that a weakly doped or intrinsically conducting region is pyrolytically grown from the gaseous phase onto the collector layer 8. The base layer 10 is thereafter deposited from the gaseous phase upon the intermediate layer 9. The base layer may be given a specific resistance of 0.5 ohm·cm. and a thickness of 5 micron. Deposited upon the base layer is a p-type emitter layer 11 of very low ohmic resistance, for example 0.005 ohm·cm., having a thickness of approximately 50 microns. The electrode connecting terminals 6 and 12 for the collector and emitter respectively are produced by coalescence of a metal sheet or mesh with the respective semiconductor layers in the manner already described. The base connection 13 is preferably made in accordance with the conventional method, namely after the processing of the device is otherwise completed in the above-described manner.

In semiconductor devices with very thin layers it is of advantage to use a metal of low melting point for contacting the last grown layer, because otherwise, when molybdenum is used for such contacting, the necessary high temperatures may affect the doping of the layers by diffusion.

As described above, the method according to the invention affords producing a large number of completely contacted rectifier and other semiconductor elements within a single course of fabricating operation.

The method of the invention can also be employed in such a manner that a plurality of layers are produced in the above-described manner by decomposition from the gaseous phase, whereas thereafter one or more additional layers are produced by alloying or diffusing the additional material together with the layers previously produced pyrolytically.

The method according to the invention is also applicable for the growing of germanium layers, for example from gaseous germanium tetrachloride or germanium chloroform. The pyrolytic precipitation temperatures in such cases are correspondingly lower, which permits a simplification of the necessary furnace or heating devices.

I claim:

1. The method of producing a p-n junction semiconductor device, which comprises placing a number of bodies of monocrystalline semiconductor material upon a common metallic support, heating the bodies on said support by directly heating said support, pyrolytically precipitating semiconductor material from a gaseous compound of the same semiconductor material on said bodies and support thus growing at least one stratum upon each of said bodies and simultaneously bonding said bodies to said support, thereafter severing said support into respective parts of which each remains integral with one of the then separated semiconductor devices respectively and forms an electric terminal thereof.

2. The methods of producing a p-n junction semiconductor device, which comprises placing a number of bodies of monocrystalline hyperpure silicon upon the top surface of a metal sheet, heating the bodies on said sheet by directly heating said sheet, and subjecting them jointly to pyrolytic precipitation of silicon from a gaseous atmosphere containing a gaseous silicon compound thus growing at least one stratum upon each of said bodies and simultaneously bonding said bodies to said sheet, thereafter dividing said sheet into respective parts of which each is a component of the then separated semiconductor devices respectively and forms an electric terminal thereof.

3. The method of producing a p-n junction semiconductor device, which comprises placing a number of bodies of monocrystalline semiconductor material upon a common sheet-metal support within a reaction chamber whose bottom surface is formed by said support, heating the support and said bodies and subjecting the bodies to pyrolytic precipitation of semiconductor material from a gaseous compound of the same material thus growing at least one stratum upon each of said bodies and simultaneously bonding said bodies to said support, thereafter severing said support into respective parts of which each remains integral with one of the then separated semiconductor devices respectively and forms an electric terminal thereof.

4. The method of producing a p-n junction semiconductor device, which comprises placing a number of bodies of moncrystalline semiconductor material upon a common sheetmetal support within a reaction chamber whose bottom surface is formed by said support, heating the support and said bodies and subjecting the bodies to pyrolytic precipitation of semiconductor material from a gaseous compound of the same material thus growing at least one stratum upon each of said bodies and simultaneously bonding said bodies to said support, then placing a single metallic web member onto the last-grown stratum of each body and heating said bodies and said web member to a temperature at which said web member becomes fusion-bonded to said bodies, thereafter severing said support and said web member into respective parts so that one part of each remains integral with one of the respective bodies then separated from each other and forms an electric terminal thereof.

5. The method of producing semiconductor devices according to claim 2, comprising the step of silicon-coating said metal sheet before placing upon it said bodies with the silicon coating adjacent thereto.

6. The method of producing a p-n junction semiconductor device, which comprises placing a number of bodies of monocrystalline silicon upon a silicon-coated top surface of a metal sheet, heating the bodies on said sheet, pyrolytically precipitating silicon from a gaseous atmosphere containing a gaseous silicon compound onto said bodies and sheet thus growing at least one stratum upon each of said bodies and simultaneously bonding said bodies to said sheet, then placing a silicon-coated web member upon the last-grown strata of said bodies with the silicon coating in contact with said bodies and heating said bodies and said web member to a temperature at which said web member becomes fusion-bonded to said bodies, thereafter severing said sheet and said web member into respective parts so that one part of each remains integral with one of the respective bodies then separated from each other and forms an electric terminal thereof.

7. The method of producing semiconductor devices according to claim 1, comprising the step of masking during pyrolytic precipitation a portion of the growing bodies so as to obtain a predetermined shape of the completed semiconductor structure of the device.

8. In the method of producing semiconductor devices according to claim 1, the step of heating said metal support to thereby heat said bodies to pyrolytic precipitation temperature.

9. The method of producing semiconductor devices according to claim 2, which comprises heating said metal sheet by passing electric current through said sheet, said heated sheet forming a heat source for maintaining said bodies at pyrolytic temperature.

10. The method of producing semiconductor devices according to claim 1, which comprises spacing the bodies from each other on said support, and electrically heating said support to thereby heat the bodies, as well as the gas contacting the support between said bodies, to pyrolytic decomposition temperature of the gas.

11. The method of producing a p-n junction semiconductor device, which comprises placing a number of bodies of monocrystalline semiconductor material upon a common molybdenum support, heating the bodies on said support by directly heating said support, pyrolytically precipitating semiconductor material from a gaseous compound of the same semi-conductor material on said bodies and support thus growing at least one stratum upon each of said bodies and simultaneously bonding said bodies to said support, thereafter severing said support into respective parts of which each remains integral with one of the then separated semiconductor devices respectively and forms an electric terminal thereof.

12. The method of producing a p-n junction semiconductor device, which comprises placing a number of bodies of monocrystalline semiconductor material upon a common tantalum support, heating the bodies on said support by directly heating said support, pyrolytically precipitating semiconductor material from a gaseous compound of the same semi-conductor material on said bodies and support thus growing at least one stratum upon each of said bodies and simultaneously bonding said bodies to said support, thereafter severing said support into respective parts of which each remains integral with one of the then separated semiconductor devices respectively and forms an electric terminal thereof.

13. The method of producing a p-n junction semiconductor device, which comprises placing a number of bodies of monocrystalline hyperpure silicon upon the top surface of a molybdenum sheet, heating the bodies on said sheet by directly heating said sheet, pyrolytically precipitating silicon from a gaseous atmosphere containing a gaseous silicon compound thus growing at least one stratum upon each of said bodies and simultaneously bonding said bodies to said sheet, thereafter dividing said sheet into respective parts of which each is a component of the then separated semiconductor devices respectively and forms an electric terminal thereof.

14. The method of producing a p-n junction semiconductor device, which comprises placing a number of bodies of monocrystalline hyperpure silicon upon the top surface of a tantalum sheet, heating the bodies on said sheet by directly heating said sheet, pyrolytically precipitating silicon from a gaseous atmosphere containing a gaseous silicon compound thus growing at least one stratum upon each of said bodies and simultaneously bonding said bodies to said sheet, thereafter dividing said sheet into respective parts of which each is a component of the then separated semiconductor devices respectively and forms an electric terminal thereof.

References Cited in the file of this patent

UNITED STATES PATENTS

| | | |
|---|---|---|
| 2,692,839 | Christensen et al. | Oct. 26, 1954 |
| 2,850,414 | Enomoto | Sept. 2, 1958 |
| 2,910,394 | Scott et al. | Oct. 27, 1959 |
| 3,030,704 | Hall | Apr. 4, 1962 |

FOREIGN PATENTS

| | | |
|---|---|---|
| 1,151,572 | France | Aug. 26, 1957 |
| 1,029,941 | Germany | May 14, 1958 |